(12) United States Patent
Ulbricht et al.

(10) Patent No.: US 9,587,061 B2
(45) Date of Patent: Mar. 7, 2017

(54) CO-CROSSLINKER SYSTEMS FOR ENCAPSULATION FILMS COMPRISING UREA COMPOUNDS

(71) Applicants: Daniel Ulbricht, Darmstadt (DE); Marcel Hein, Niedernberg (DE); Frank Kleff, Bruchkoebel-Oberissigheim (DE); Stephanie Schauhoff, Langen (DE); Juergen Ohlemacher, Bad Vilbel (DE)

(72) Inventors: Daniel Ulbricht, Darmstadt (DE); Marcel Hein, Niedernberg (DE); Frank Kleff, Bruchkoebel-Oberissigheim (DE); Stephanie Schauhoff, Langen (DE); Juergen Ohlemacher, Bad Vilbel (DE)

(73) Assignee: Evonik Degussa GmbH, Essen (DE)

( * ) Notice: Subject to any disclaimer, the term of this patent is extended or adjusted under 35 U.S.C. 154(b) by 0 days.

(21) Appl. No.: 14/973,235

(22) Filed: Dec. 17, 2015

(65) Prior Publication Data
US 2016/0177013 A1    Jun. 23, 2016

(30) Foreign Application Priority Data
Dec. 19, 2014 (EP) .................................. 14199289

(51) Int. Cl.
| C07D 251/34 | (2006.01) |
| C08F 255/02 | (2006.01) |
| C08K 5/14 | (2006.01) |
| C08K 5/5425 | (2006.01) |
| C08J 5/18 | (2006.01) |
| H01L 31/18 | (2006.01) |
| H01L 31/048 | (2014.01) |
| C09D 123/04 | (2006.01) |

(52) U.S. Cl.
CPC ............. *C08F 255/026* (2013.01); *C08J 5/18* (2013.01); *C08K 5/14* (2013.01); *C08K 5/5425* (2013.01); *C09D 123/04* (2013.01); *H01L 31/0481* (2013.01); *H01L 31/186* (2013.01); *C08J 2351/06* (2013.01)

(58) Field of Classification Search
USPC ........................................................ 544/221
See application file for complete search history.

(56) References Cited

U.S. PATENT DOCUMENTS

| 792,783 | A | 6/1905 | Muthmann |
| 2,537,816 | A | 1/1951 | Dudley |
| 2,894,950 | A | 7/1959 | Llyod et al. |
| 3,065,231 | A | 11/1962 | Frazier, Jr. et al. |
| 3,322,761 | A | 5/1967 | Little et al. |
| 3,655,519 | A | 4/1972 | Scherhag et al. |
| 3,700,667 | A | 10/1972 | Kitano et al. |
| 4,196,289 | A | 4/1980 | Saito et al. |
| 4,319,062 | A | 3/1982 | Boozalis et al. |
| 4,451,651 | A | 5/1984 | Brand |
| 4,519,930 | A | 5/1985 | Kakiuchi |
| 4,684,689 | A | 8/1987 | Yannich et al. |
| 4,935,470 | A | 6/1990 | Tanuma et al. |
| 5,352,530 | A | 10/1994 | Tanuma et al. |
| 5,367,025 | A | 11/1994 | Needham |
| 5,372,887 | A | 12/1994 | Segawa et al. |
| 5,556,635 | A | 9/1996 | Istin et al. |
| 5,723,703 | A | 3/1998 | De Jong et al. |
| 6,602,825 | B1 * | 8/2003 | Menke ................... A01N 43/64 544/221 |
| 8,691,983 | B2 * | 4/2014 | Wen ..................... A61F 2/30767 544/221 |
| 2001/0045229 | A1 | 11/2001 | Komori et al. |
| 2002/0018883 | A1 | 2/2002 | Okazaki et al. |
| 2003/0111159 | A1 | 6/2003 | Hashimoto et al. |
| 2006/0008665 | A1 | 1/2006 | Kotsubo et al. |
| 2007/0259998 | A1 | 11/2007 | Okada et al. |
| 2008/0176994 | A1 | 7/2008 | Allermann et al. |
| 2008/0274245 | A1 | 11/2008 | Lee et al. |
| 2010/0229946 | A1 | 9/2010 | Kataoka |
| 2011/0027601 | A1 | 2/2011 | Ruffner, Jr. |
| 2011/0263748 | A1 | 10/2011 | Schauhoff et al. |
| 2012/0024376 | A1 | 2/2012 | Fukudome et al. |
| 2012/0077911 | A1 | 3/2012 | Haraguchi et al. |
| 2012/0095223 | A1 | 4/2012 | Yamaura |
| 2012/0095224 | A1 | 4/2012 | Yamaura |
| 2012/0095225 | A1 | 4/2012 | Yamaura |
| 2012/0202070 | A1 | 8/2012 | Asanuma et al. |

(Continued)

FOREIGN PATENT DOCUMENTS

| CA | 893 127 A | 2/1972 |
| CN | 102304246 A | 1/2012 |

(Continued)

OTHER PUBLICATIONS

James R. Dudley, et al. "Cyanuric Chloride Derivatives. III. Alkoxy-s-Triazines" Contribution from the Stamford Research Laboratories of the American Cyanamid Company, Journal of the American Chemical Society, vol. 73, Jul. 1951, pp. 2986-2990.

European Search Report issued Jun. 19, 2015 in European Application No. 14199289.1 (with English Translation of Categories of Cited Documents).

*Primary Examiner* — Dung Le
(74) *Attorney, Agent, or Firm* — Oblon, McClelland, Maier & Neustadt, L.L.P.

(57) ABSTRACT

A first composition (A) contains (i) at least one compound (I) selected from the group consisting of triallyl isocyanurate, and triallyl cyanurate, wherein the compound (I) is preferably triallyl isocyanurate; and (ii) at least one urea compound. A second composition (B) contains the first composition (A) and at least one polyolefin copolymer. Composition (B) is used for producing a film for encapsulating an electronic device, in particular a solar cell.

18 Claims, No Drawings

(56) References Cited

U.S. PATENT DOCUMENTS

| | | |
|---|---|---|
| 2012/0285529 A1 | 11/2012 | Kataoka et al. |
| 2014/0296400 A1 | 10/2014 | Ikeda et al. |
| 2015/0353784 A1 | 12/2015 | Yamaura et al. |
| 2016/0068662 A1 | 3/2016 | Yamaura et al. |
| 2016/0177007 A1 | 6/2016 | Ulbricht et al. |
| 2016/0177013 A1 | 6/2016 | Ulbricht et al. |
| 2016/0177014 A1 | 6/2016 | Ulbricht et al. |
| 2016/0177015 A1 | 6/2016 | Ulbricht et al. |
| 2016/0177124 A1 | 6/2016 | Ulbricht et al. |

FOREIGN PATENT DOCUMENTS

| | | |
|---|---|---|
| CN | 102372813 A | 3/2012 |
| CN | 102391568 A | 3/2012 |
| CN | 102504715 B | 2/2014 |
| CN | 103804774 A | 5/2014 |
| CN | 103881596 A | 6/2014 |
| CN | 103923374 A | 7/2014 |
| EP | 0 227 470 A2 | 7/1987 |
| EP | 0 227 470 A3 | 7/1987 |
| EP | 0 358 007 A2 | 3/1990 |
| EP | 0 406 664 A1 | 1/1991 |
| EP | 1 164 167 A1 | 12/2001 |
| EP | 1 506 978 A1 | 2/2005 |
| EP | 2 355 163 A1 | 8/2011 |
| EP | 2 562 821 A1 | 2/2013 |
| EP | 3 034 525 A1 | 6/2016 |
| EP | 3 034 526 A1 | 6/2016 |
| EP | 3 034 530 A1 | 6/2016 |
| JP | 51-139854 A | 12/1976 |
| JP | 3-64389 A | 3/1991 |
| JP | 9-118860 A | 5/1997 |
| JP | 10-168419 A | 6/1998 |
| JP | 11-20097 A | 1/1999 |
| JP | 11-255753 A | 9/1999 |
| JP | 2000-26527 A | 1/2000 |
| JP | 2001-135657 A | 5/2001 |
| JP | 2001-206921 A | 7/2001 |
| JP | 2005-112925 A | 4/2005 |
| JP | 2006-36876 A | 2/2006 |
| JP | 2007-123488 A | 5/2007 |
| JP | 2007-281135 A | 10/2007 |
| JP | 2007-299917 A | 11/2007 |
| JP | 2007-305634 A | 11/2007 |
| JP | 2008-98457 A | 4/2008 |
| JP | 2008-205448 A | 9/2008 |
| JP | 2008-260894 A | 10/2008 |
| JP | 2009-135200 A | 6/2009 |
| JP | 2011-111515 A | 6/2011 |
| JP | 2011-173937 A | 9/2011 |
| JP | 2012-41466 A | 3/2012 |
| JP | 2012-67174 A | 4/2012 |
| JP | 2012-74616 A | 4/2012 |
| JP | 2012-87260 A | 5/2012 |
| KR | 10-2004-0090340 | 7/2014 |
| KR | 10-2015-0059957 | 6/2015 |
| WO | WO 99/37730 A1 | 7/1999 |
| WO | WO 02/42342 A2 | 5/2002 |
| WO | WO 2004/048463 A1 | 6/2004 |
| WO | WO 2005/100018 A1 | 10/2005 |
| WO | WO 2008/006661 A2 | 1/2008 |
| WO | WO 2008/009540 A1 | 1/2008 |
| WO | WO 2008/053810 A1 | 8/2008 |
| WO | WO 2014/129573 A1 | 8/2014 |
| WO | WO 2014/189019 A1 | 11/2014 |
| WO | WO 2015/149632 A1 | 10/2015 |

* cited by examiner

CO-CROSSLINKER SYSTEMS FOR ENCAPSULATION FILMS COMPRISING UREA COMPOUNDS

BACKGROUND OF THE INVENTION

Field of the Invention

The present invention relates to a first composition (A) comprising (i) at least one compound (I) selected from the group consisting of triallyl isocyanurate, triallyl cyanurate, wherein the compound (I) is preferably triallyl isocyanurate; and (ii) at least one urea compound. The present invention additionally relates to a second composition (B) comprising the first composition (A) and at least one polyolefin copolymer. The present invention finally relates to the use of the composition (B) for producing a film for encapsulating an electronic device, in particular a solar cell.

Discussion of the Background

Photovoltaic modules (photovoltaic="PV") typically consist of a layer of symmetrically arranged silicon cells welded into two layers of a protective film. This protective film is in turn itself stabilized by a "backsheet" on its reverse side and a "frontsheet" on its front side. The backsheet and frontsheet may either be suitable plastics material films or may be made of glass. The function of the encapsulation material is essentially to protect the PV module from weathering effects and mechanical stress, and for that reason the mechanical stability of the particular encapsulation material is an important property. In addition, good encapsulation materials exhibit a rapid curing rate, high gel content, high transmission, low tendency to temperature- and heat-induced discolouration and high adhesion (i.e. a low propensity for UV-induced delamination).

The encapsulation materials described for this purpose in the related art (for example WO 2008/036708 A2) are typically based on materials such as silicone resins, polyvinyl butyral resins, ionomers, polyolefin films or ethylene-vinyl acetate copolymers ("EVA").

Processes for producing such encapsulation films are familiar to those skilled in the art (EP 1 164 167 A1). In these processes the crosslinkers, together with a polyolefin copolymer (and possibly further additives), are homogeneously mixed in an extruder for example, and then extruded to give a film. The process described in EP 1 164 167 A1 relates to encapsulation films based on EVA but is also applicable to films made of other materials, for example those mentioned hereinabove.

The encapsulation of the silicon cells is typically performed in a vacuum lamination oven (EP 2 457 728 A1). To this end, the layer structure of the PV module is prepared and initially heated up gradually in a lamination oven (consisting of two chambers separated by a membrane). This softens the polyolefin copolymer (for example EVA). The oven is simultaneously evacuated to remove the air between the layers. This step is the most critical and takes between 4 and 6 minutes. Subsequently, the vacuum is broken via the second chamber, and the layers of the module are welded to one another by application of pressure. Heating is simultaneously continued up to the crosslinking temperature, the crosslinking of the film then taking place in this final step.

The use of EVA in particular is standard in the production of encapsulation films for solar modules. However, EVA also has a lower specific electrical resistance ρ than polyolefins for instance. This makes the use of EVA films as encapsulation material less attractive, since it is specifically encapsulation materials having a high specific electrical resistance ρ that are desired.

This is because the so-called "PID" effect (PID=potential-induced degradation) currently represents a major quality problem for PV modules. The term "PID" is understood to mean a voltage-induced performance degradation caused by so-called "stray currents" within the PV module.

The damaging stray currents are caused not only by the structure of the solar cell but also by the voltage level of the individual PV modules with respect to the earth potential—in most unearthed PV systems, the PV modules are subjected to a positive or negative voltage. PIP usually occurs at a negative voltage relative to the earth potential and is accelerated by high system voltages, high temperatures and high atmospheric humidity. As a result, sodium ions migrate out of the cover glass of the PV module to the interface of the solar cell and cause damage ("shunts") there, which may lead to performance losses or even to the total loss of the PV module.

The risk of a PID effect occurring may be markedly reduced by increasing the specific electrical resistance ρ of the encapsulation films.

The specific electrical resistance p or else volume resistivity (also abbreviated to "VR" hereinbelow) is a temperature-dependent material constant. It is utilized to calculate the electrical resistance of a homogeneous electrical conductor. Specific electrical resistance is determined in accordance with the invention by means of ASTM-D257.

The higher the specific electrical resistance ρ of a material, the lower the susceptibility of the photovoltaic modules to the PID effect. One significant positive effect of increasing the specific electrical resistance p of encapsulation films is thus an increase in the lifetime and efficiency of PV modules.

The related art discusses the problem of the PID effect in connection with encapsulation films for PV modules in CN 103525321 A. This document describes an EVA-based film for encapsulating solar cells, which comprises triallyl isocyanurate ("TAIC") and trimethylolpropane trimethacrylate ("TMPTMA") as co-crosslinkers and, as further additives, preferably comprises a polyolefin ionomer and a polysiloxane for hydrophobization. This film exhibits a reduced PID effect. However this film has the disadvantage that polyolefin ionomers are relatively costly. Polysiloxanes moreover have an adverse effect on adhesion properties. In addition, the examples do not give any specific information as to the improvements achievable with particular concentrations.

JP 2007-281135 A also describes a crosslinker combination of TAIC and TMPTMA. The TMPTMA acts as an accelerant for the crosslinking reaction and thus brings about enhanced productivity.

JP 2012-067174 A and JP 2012-087260 A describe an encapsulation film for solar cells based on EVA/a polyolefin, which comprises not only TAIC but also, for example, ethylene glycol dimethacrylate, neopentyl glycol dimethacrylate, hexane-1,6-diol dimethacrylate as crosslinkers. These co-crosslinkers initially retard the crosslinking reaction somewhat and thus increase the processing time window.

JP 2009-135200 A likewise describes crosslinkers comprising TAIC and various (meth)acrylate derivatives of polyfunctional alcohols, improved heat resistance coupled with a reduced tendency for delamination of the EVA-based encapsulation being described in this case.

JP 2007-281135 A and JP 2007-305634 A describe crosslinker combinations of TAIC and trimethylolpropane triacrylate ("TMPTA") for use in the production of multilayer co-extruded EVA encapsulation films for solar cells.

Similar combinations of crosslinkers for solar cell encapsulation films are described, for example, by JP 2013-138094 A, JPH11-20094, JPH11-20095, JPH11-20096, JPH11-20097, JPH11-20098, JPH11-21541, CN 102391568 A, CN 102504715 A, CN 102863918 A, CN 102911612 A, CN 103045105 A, CN 103755876 A, CN 103804774 A, US 2011/0160383 A1, WO 2014/129573 A1.

There is accordingly a need for novel co-crosslinker systems, in particular for producing encapsulation films for solar cells, which, compared to films crosslinked in accordance with the related art, result in a markedly increased electrical resistance and thus lead to a reduction in the PID risk when employed in photovoltaic modules.

SUMMARY OF THE INVENTION

The present invention accordingly has for its object, among other objects, the provision of novel compositions which may be used for producing films having the highest possible specific electrical resistance p and which are therefore particularly suitable for encapsulating electronic devices such as solar cells for example. These compositions should additionally be employable in the established processes and should not substantially increase the costs of the films. In particular said compositions should not exhibit the disadvantages observed for the co-crosslinker systems of the related art and in particular for the compositions cited in CN 103525321 A.

It has now been found that, surprisingly, the use of particular compositions makes it possible to obtain an encapsulation film for solar cells that meets these requirements. The compositions found here considerably increase volume resistance, even when comparatively small amounts are employed, without negatively impacting other film properties. The films exhibit excellent processability, high transparency and excellent UV and heat ageing properties.

The present invention relates to a composition (A), comprising:
(i) at least one compound (I) selected from the group consisting of triallyl isocyanurate, and triallyl cyanurate; and
(ii) at least one compound (II);
wherein the compound (II) is defined by a chemical structural formula selected from the group consisting of (II-A), (II-B), (II-C), (II-D) wherein

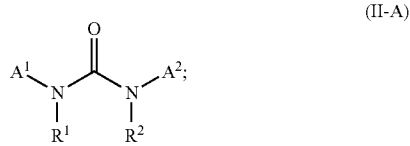

(II-A)

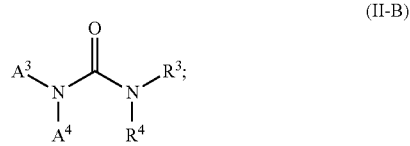

(II-B)

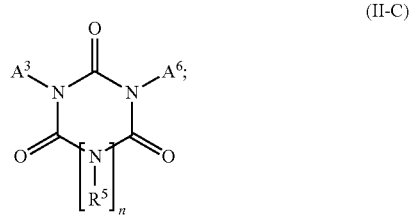

(II-C)

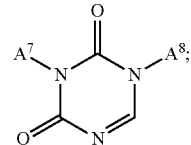

(II-D)

and wherein
n=0 or 1;
$A^1, A^2, A^3, A^4, A^5, A^6, A^7, A^8$ are each independently of one another selected from the group consisting of i) a methacryloyl group, ii) an acryloyl group, and iii) a branched or unbranched alkenyl group having 3 to 18 carbon atoms and having at least one terminal double bond;
$R^1, R^2, R^3, R^4, R^5$ are each independently of one another selected from the group consisting of the following a, b and c):
  a) hydrogen,
  b) a branched or unbranched alkyl group having 1 to 20 carbon atoms, wherein one or more hydrogen radicals may each be substituted by a halogen radical and wherein in addition one or two hydrogen radicals may each be substituted by a radical selected from the group consisting of —$OR^6$, and —$C(=O)NR^7R^8$, wherein $R^6$, $R^7$, $R^8$ are each independently of one another selected from the group consisting of hydrogen, branched and unbranched alkyl group having 1 to 10 carbon atoms, and
  c) a cycloalkyl group having 3 to 12 carbon atoms, wherein one or more hydrogen radicals may each be substituted by a halogen radical and wherein in addition one or two hydrogen radicals may each be substituted by a radical selected from the group consisting of —$OR^9$, and —$C(=O)NR^{10}R^{11}$, wherein $R^9$, $R^{10}$, $R^{11}$ are each independently of one another selected from the group consisting of hydrogen, and a branched and unbranched alkyl group having 1 to 10 carbon atoms,
and wherein the radicals $R^1$ and $R^2$ may each also be selected from the group consisting of methacryloyl group, acryloyl group, and a branched or unbranched alkenyl group having 3 to 18 carbon atoms and having at least one terminal double bond;
and wherein at least one compound (II) in the composition (A) is present in a proportion of at least 1% by weight based on a total weight of all compounds (I) in the composition (A).

The present invention also relates to a composition (B), comprising:
at least one polyolefin copolymer; and
a composition (A) as above.

In one embodiment, the present invention relates to a film for encapsulation of an electronic device, comprising:
the composition (B) as above in crosslinked form.

In another embodiment, the present invention relates to a method for encapsulating an electronic device, comprising:
contacting said electronic device with the composition (B) as above and crosslinking said composition (B).

DETAILED DESCRIPTION OF THE INVENTION

Any ranges mentioned herein below include all values and subvalues between the lowest and highest limit of this range.

The co-crosslinkers according to the present invention can surprisingly be used for producing films for encapsulating electronic devices, for example solar cells, having a high specific resistance.

Accordingly, the co-crosslinker system according to the invention is a composition (A) comprising (i) at least one compound (I) selected from the group consisting of triallyl isocyanurate, triallyl cyanurate, wherein the compound (I) is preferably triallyl isocyanurate, and (ii) at least one compound (II);

wherein the compound (II) is generally defined by a chemical structural formula selected from the group consisting of (II-A), (II-B), (II-C), (II-D) where

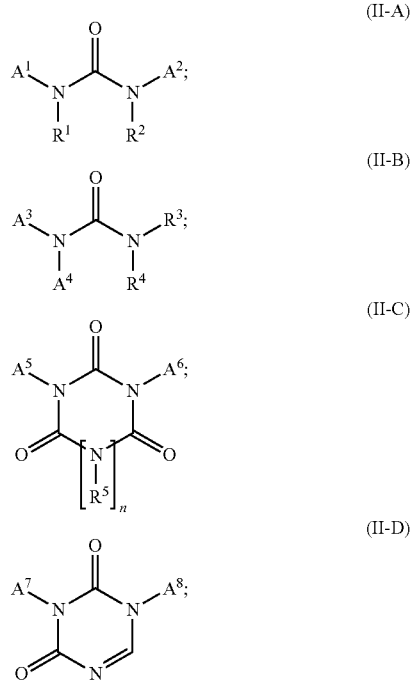

and wherein
n=0 or 1;
$A^1, A^2, A^3, A^4, A^5, A^6, A^7, A^8$ are each independently of one another selected from the group consisting of methacryloyl group, acryloyl group, branched or unbranched alkenyl group having 3 to 18 carbon atoms and having at least one terminal double bond;
$R^1, R^2, R^3, R^4, R^5$ are each independently of one another selected from the group consisting of:
hydrogen,
branched or unbranched alkyl group having 1 to 20 carbon atoms where one or more hydrogen radicals may each be substituted by a halogen radical and where in addition one or two hydrogen radicals may each be substituted by a radical selected from the group consisting of —$OR^6$, —$C(=O)NR^7R^8$, where $R^6, R^7, R^8$ are each independently of one another selected from the group consisting of hydrogen, branched and unbranched alkyl group having 1 to 10 carbon atoms,
cycloalkyl group having 3 to 12 carbon atoms where one or more hydrogen radicals may each be substituted by a halogen radical and where in addition one or two hydrogen radicals may each be substituted by a radical selected from the group consisting of —$OR^9$, —$C(=O)NR^{10}R^{11}$, where $R^9, R^{10}, R^{11}$ are each independently of one another selected from the group consisting of hydrogen, branched and unbranched alkyl group having 1 to 10 carbon atoms, and wherein the radicals $R^1$ and $R^2$ may each also be selected from the group consisting of methacryloyl group, acryloyl group, branched or unbranched alkenyl group having 3 to 18 carbon atoms and having at least one terminal double bond;

and wherein at least one compound (II) comprised by the composition (A) is present in a proportion of at least 1% by weight based on the total weight of all compounds (I) comprised by the composition (A).

In a preferred embodiment at least one compound (II) comprised by the composition (A) is present in a proportion of at least 1% to 10% by weight, preferably 2% to 6% by weight, more preferably 3% to 5% by weight and most preferably 4% by weight based on the total weight of all compounds (I) comprised by the composition (A).

In a preferred embodiment, in the composition (A) n=0 or 1;
$A^1, A^2, A^3, A^4, A^5, A^6, A^7, A^8$ are each independently of one another selected from the group consisting of methacryloyl group, acryloyl group, allyl group;
$R^1, R^2, R^3, R^4, R^5$ are each independently of one another selected from the group consisting of hydrogen, branched or unbranched alkyl group having 1 to 20 carbon atoms;
and in addition the radicals $R^1$ and $R^2$ may each also be selected from the group consisting of methacryloyl group, acryloyl group, allyl group.

In a more preferred embodiment, in the composition (A) the compound (II) is generally defined by a chemical structural formula selected from the group consisting of (II-A), (II-B), yet more preferably (II-A);

and $A^1, A^2, A^3, A^4$ are each independently of one another selected from the group consisting of methacryloyl group, acryloyl group, allyl group;
and $R^1, R^2, R^3, R^4$ are each independently of one another selected from the group consisting of hydrogen, branched or unbranched alkyl group having 1 to 20 carbon atoms;
and in addition the radicals $R^1$ and $R^2$ may each also be selected from the group consisting of methacryloyl group, acryloyl group, allyl group.

It is most preferable when in the composition (A) the compound (II) is selected from 1,3-diallylurea, triallylurea, diallylimidazolidinetrione, diallyl isocyanurate, diallyl n-propyl isocyanurate.

In the context of the invention a compound of chemical structure (II) is also referred to as a "urea compound".

The term "at least one compound (II) comprised by the composition (A) is present in a proportion of at least 1% by weight based on the total weight of all compounds (I) comprised by the composition (A)" is to be understood as meaning that at least one compound conforming to one of the general formulae (II-A), (II-B), (II-C), (II-D) is present in the composition (A) in an amount of at least 1% by weight based on the total weight of all compounds (I) comprised by composition (A).

This means, for example, that in the embodiment according to the invention in which the composition (A) comprises triallyl isocyanurate as compound (I) and 1,3-diallylurea (CAS Number: 1801-72-5) as compound (II) the 1,3-diallylurea is present in a proportion of at least 1% by weight based on the weight of the triallyl isocyanurate. In a yet more preferred embodiment the proportion of 1,3-diallylurea based on the weight of the triallyl isocyanurate is then 3% to 5% by weight, particularly preferably 4.14% by weight.

1,3-Diallylurea is a compound of formula (II-A) where $A^1=A^2$=allyl and $R^1=R^2$=H.

This also means, for example, that in the embodiment according to the invention in which the composition (A) comprises triallyl isocyanurate as compound (I) and triallylurea as compound (II) the triallylurea is present in a proportion of at least 1% by weight based on the weight of the triallyl isocyanurate. In a yet more preferred embodiment the proportion of triallylurea based on the weight of the triallyl isocyanurate is then 1% to 3% by weight, particularly preferably 2.06% by weight. Triallylurea is a compound of formula $$\text{where } A^1=A^{21}=R^1=\text{allyl and } R^2=\text{H.} \tag{II-A}$$

This also means, for example, that in the embodiment according to the invention in which the composition (A) comprises triallyl isocyanurate as compound (I) and diallylimidazolidinetrione as compound (II) the diallylimidazolidinetrione is present in a proportion of at least 1% by weight based on the weight of the triallyl isocyanurate. In a yet more preferred embodiment the proportion of diallylimidazolidinetrione based on the weight of the triallyl isocyanurate is then 1.5% to 4.5% by weight, particularly preferably 2.0% to 4.2% by weight. Diallylimidazolidinetrione is a compound of formula (II-C) where n=0 and $A^5=A^6$=allyl.

This also means, for example, that in the embodiment according to the invention in which the composition (A) comprises triallyl isocyanurate as compound (I) and diallyl isocyanurate as compound (II) the diallyl isocyanurate is present in a proportion of at least 1% by weight based on the weight of the triallyl isocyanurate. In a yet more preferred embodiment the proportion of diallyl isocyanurate based on the weight of the triallyl isocyanurate is then 1.0% to 4.5% by weight, particularly preferably 1.5% to 4.0% by weight. Diallyl isocyanurate is a compound of formula (II-C) where n=1, $R^5$=H and $A^5=A^6$=allyl.

This also means, for example, that in the embodiment according to the invention in which the composition (A) comprises triallyl isocyanurate as compound (I) and diallyl n-propyl isocyanurate as compound (II) the diallyl n-propyl isocyanurate is present in a proportion of at least 1% by weight based on the weight of the triallyl isocyanurate. In a yet more preferred embodiment the proportion of diallyl n-propyl isocyanurate based on the weight of the triallyl isocyanurate is then 1.2% to 5.0% by weight, particularly preferably 3.7% by weight. Diallyl n-propyl isocyanurate is a compound of formula (II-C) where n=1, $R^5$=n-propyl and $A^5=A^6$=allyl.

This also means, for example, that in the embodiment according to the invention in which the composition (A) comprises triallyl isocyanurate as compound (I) and two compounds (II), namely 1,3-diallylurea (CAS Number 1801-72-5) and triallylurea, at least one of the compounds 1,3-diallylurea and triallylurea is present in a proportion of at least 1% by weight based on the weight of the triallyl isocyanurate. It will be appreciated that this also comprehends the case where 1,3-diallylurea is present in a proportion of at least 1% by weight and triallylurea is also present in a proportion of at least 1% by weight based in each case on the weight of the triallyl isocyanurate.

The groups "methacryloyl group", "acryloyl group", "allyl group" and "methylallyl group" each have the following chemical structure:

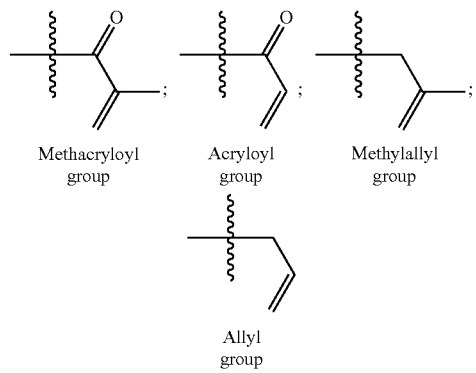

In the context of the invention a "branched or unbranched alkenyl group having at least one terminal double bond" is a monovalent branched or unbranched hydrocarbon group having at least one terminal double bond.

In the context of the invention a "branched or unbranched alkenyl group having 3 to 18 carbon atoms and having at least one terminal double bond" preferably has the chemical structure

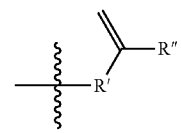

where R' is an unbranched or branched alkylene group having x carbon atoms and R" independently thereof is hydrogen or an unbranched or a branched alkyl group having y carbon atoms where x and y are integers;

and where x when R"=H is in the range from 1 to 16 (when x=1, R' is methylene); and where x in the case where R"=unbranched or branched alkyl group is in the range from 1 to 15 and y is then in the range from 1 to (16−x) where the sum of x+y must not then exceed 16.

In particular, R"=H or methyl and R' is an unbranched or branched alkylene group having 1 to 15 carbon atoms. Preferably, R"=H or methyl and R' is an unbranched alkylene group having 1 to 10 carbon atoms. More preferably, R'=methylene and R"=H or methyl.

An "alkylene group" in the context of the invention is a divalent saturated hydrocarbyl radical.

In order to assure the homogeneity of the film and the efficacy of the film, it is essential that at least one compound (II) comprised by the composition (A) is present in a proportion of at least 1% by weight based on the total weight of all compounds (I) comprised by the composition (A). This ensures that the specific resistance of the films obtainable therewith attains the particular values needed for large industrial scale applications and that sufficient improvement compared to the related art crosslinker systems is achieved. The compositions in which not a single compound (II) is present in such a sufficient amount do not contribute to a sufficient degree to an increase in specific resistance.

With regard to the proportion of all compounds of chemical structure (II) in the composition (A), this proportion is restricted only by the abovedescribed specification regarding the proportion of at least one compound (II) comprised by the composition (A). It is preferable when the total weight of all compounds of chemical structure (II) comprised by the composition (A) in the composition (A), based on the total weight of all compounds (I) comprised by the composition (A), is at least 1% by weight, in particular in the range from 1% to 50.0% by weight, preferably 2% to 20.0% by weight and more preferably 3% to 10.0% by weight.

The present co-crosslinker systems are preferably used for producing films for encapsulating electronic devices, for example solar cells in PV modules.

These co-crosslinker systems are typically used together with polyolefin copolymers.

The present invention accordingly also relates to a composition (B) comprising at least one polyolefin copolymer and the composition (A) according to the invention.

Polyolefin copolymers usable in accordance with the invention are known to those skilled in the art and are described, for instance, in WO 2008/036708 A2 and JP 2012-087260.

Polyolefin copolymers used in accordance with the invention are in particular ethylene/α-olefin interpolymers, the term "interpolymer" meaning that the polyolefin copolymer in question has been prepared from at least two different monomer units. Thus, the term "interpolymer" comprehends in particular polyolefin copolymers of precisely two monomer units but also terpolymers (for example ethylene/propylene/1-octene, ethylene/propylene/butene, ethylene/butene/1-octene, ethylene/butene/styrene) and tetrapolymers.

Polyolefin copolymers useful in accordance with the invention include in particular ethylene/α-olefin copolymers which preferably comprise no further monomer units in addition to ethylene and the α-olefin, where in the context of the invention the "α-olefin" is preferably selected from the group consisting of propene, 1-butene, 4-methyl-1-pentene, 1-hexene, 1-octene, 1-decene, 1-dodecene, 1-tetradecene, 1-hexadecene, 1-octadecene, 3-cyclohexyl-1-propene, vinylcyclohexane, acrylic acid, methacrylic acid, norbornene, styrene, methylstyrene, vinyl acetate.

Yet more preferably, the polyolefin copolymer according to the invention in the composition (B) is an ethylene-vinyl acetate copolymer.

When the polyolefin copolymers employed are ethylene/α-olefin interpolymers, these have, in particular, an α-olefin content in the range from 15% to 50% by weight based on the total weight of the ethylene/α-olefin interpolymer. The α-olefin content is then preferably in the range from 20% to 45% by weight, more preferably in the range from 25% to 40% by weight, yet more preferably 26% to 34% by weight and most preferably 28% to 33% by weight based in each case on the total weight of the ethylene/α-olefin interpolymer.

In the preferred embodiment in which the polyolefin copolymer is an ethylene-vinyl acetate copolymer, the ethylene-vinyl acetate copolymer has, in particular, a vinyl acetate content in the range from 15% to 50% by weight based on the total weight of the ethylene-vinyl acetate copolymer. The vinyl acetate content is then preferably in the range from 20% to 45% by weight, more preferably in the range from 25% to 40% by weight, yet more preferably 26% to 34% by weight and most preferably 28% to 33% by weight based in each case on the total weight of the ethylene/vinyl acetate copolymer.

The α-olefin content, and in particular in the case of the ethylene/vinyl acetate copolymer the content of vinyl acetate, is determined here by the method described in ASTM D 5594:1998 ["*Determination of the Vinyl Acetate Content of Ethylene-Vinyl Acetate (EVA) Copolymers by Fourier Transform Infrared Spectroscopy*"].

There is no particular restriction here upon the proportion of the composition (A) comprised by the composition (B). The proportion of the composition (A) in the composition (B) is in particular in the range from 0.05% to 10% by weight, preferably in the range from 0.1% to 5% by weight, more preferably 0.2% to 3% by weight and yet more preferably 0.5% by weight based in each case on the mass of all polyolefin copolymers comprised by the composition (B).

In accordance with the invention the composition (B) is suitable for producing an encapsulation film for electronic devices, for example solar cells. To this end it is subjected to a crosslinking reaction during solar module lamination.

To initiate the crosslinking reaction it is customary to use initiators, i.e. free-radical formers activatable by means of heat, light, moisture or electron beams.

In a preferred embodiment of the present invention the composition (B) therefore also comprises an initiator selected from the group consisting of peroxidic compounds, azo compounds, photoinitiators. More preferably, the initiator is selected from the group consisting of peroxidic compounds, azo compounds, yet more preferably a peroxidic compound. Examples thereof are described in "*Encyclopedia of Chemical Technology* 1992, 3rd Edition, Vol. 17, pages 27-90".

Peroxidic compounds are in particular organic peroxides, which are in turn selected from the group consisting of dialkyl peroxides, diperoxy ketals, peroxycarboxylic esters, peroxycarbonates, preferably peroxycarbonates.

Dialkyl peroxides are in particular selected from the group consisting of dicumyl peroxide, di-tert-butyl peroxide, di-tert-hexyl peroxide, tert-butylcumyl peroxide, isopropylcumyl tert-butyl peroxide, tert-hexylcumyl peroxide, 2,5-dimethyl-2,5-di(tert-butylperoxy)hexane, 2,5-dimethyl-2,5-di(tert-amylperoxy)hexane, 2,5-dimethyl-2,5-di(tert-butylperoxy)-hex-3-yne, 2,5-dimethyl-2,5-di(tert-amylperoxy)-hex-3-yne, α,α-di[(tert-butylperoxy)-isopropyl]benzene, di-tert-amyl peroxide, 1,3,5-tri[(tert-butylperoxy)isopropyl]benzene, 1,3-dimethyl-3-(tert-butylperoxy)butanol, 1,3-dimethyl-3-(tert-amylperoxy)butanol, isopropylcumyl hydroperoxide.

Diperoxy ketals are in particular selected from the group consisting of 1,1-di(tert-butylperoxy)-3,3,5-trimethylcyclohexane, 1,1-di(tert-amylperoxy)cyclohexane, 1,1-di(tert-butylperoxy)cyclohexane, n-butyl 4,4-di(tert-amylperoxy)valerate, ethyl 3,3-di(tert-butylperoxy)butyrate, 2,2-di(tert-butylperoxy)butane, 3,6,6,9,9-pentamethyl-3-ethoxycarbonylmethyl-1,2,4,5-tetraoxacyclononane, 2,2-di(tert-amylperoxy)propane, n-butyl 4,4-bis(tert-butylperoxy)valerate.

Peroxycarboxylic esters are in particular selected from the group consisting of tert-amyl peroxyacetate, tert-butyl peroxy-3,5,5-trimethylhexanoate, tert-amyl peroxybenzoate, tert-butyl peroxyacetate, tert-butyl peroxybenzoate, OO-tert-butyl monoperoxysuccinate, OO-tert-amyl monoperoxysuccinate.

Peroxycarbonates are in particular selected from the group consisting of tert-butyl peroxy-2-ethylhexylcarbonate, tert-butyl peroxy-iso-propylcarbonate, tert-amyl peroxy-2-ethylhexylcarbonate, tert-amyl peroxybenzoate. A preferred peroxycarbonate is tert-butyl peroxy-2-ethylhexylcarbonate (also abbreviated hereinbelow to "TBPEHC").

The azo compound is preferably selected from the group consisting of 2,2'-azobis(2-acetoxypropane), 1,1'-azodi(hexahydrobenzonitrile).

The initiator is particularly preferably selected from the group consisting of 2,5-dimethyl-2,5-di(tert-butylperoxy) hexane, tert-butyl peroxy-2-ethylhexylcarbonate, tert-butyl peroxy-3,5,5-trimethylhexanoate, 1,1-di(tert-butylperoxy)-3,5,5-trimethylcyclohexane, tert-amyl peroxy-2-ethylhexyl-carbonate; the initiator tert-butyl peroxy-2-ethylhexylcarbonate ("TBPEHC") being most preferred.

There is no particular restriction upon the mass of the peroxidic compound or of the azo compound, preferably of the peroxidic compound, which is employed based on the mass of the polyolefin copolymer. The peroxidic compound or the azo compound, preferably the peroxidic compound, is in particular employed in an amount of from 0.05% to 10% by weight, preferably 0.1% to 5% by weight and more preferably 0.5% to 2% by weight based in each case on the mass of all polyolefin copolymers comprised by the composition (B).

Photoinitiators are in particular selected from the group consisting of benzophenone, benzanthrone, benzoin, benzoin alkyl ethers, 2,2-diethoxyacetophenone, 2,2-dimethoxy-2-phenylacetophenone, p-phenoxydichloroacetophenone, 2-hydroxycyclohexylphenone, 2-hydroxyisopropylphenone, 1-phenylpropanedione 2-(ethoxycarbonyl)oxime.

The photoinitiator is in particular employed in an amount of from 0.05% to 10% by weight, preferably 0.1% to 5% by weight, more preferably 0.2% to 3% by weight and yet more preferably 0.25% to 1% by weight based in each case on the mass of all polyolefin copolymers comprised by the composition (B).

In a further preferred embodiment of the present invention the composition (B) also comprises at least one further compound selected from the group consisting of crosslinkers, silane coupling agents, antioxidants, ageing stabilizers, metal oxides, metal hydroxides, white pigments, preference being given to using silane coupling agents as further compound.

In the context of the invention the term "further compound" implies that this compound is not triallyl isocyanurate, triallyl cyanurate or a compound of chemical structure (II).

Here, crosslinkers are preferably selected from the group consisting of trimethylolpropane triacrylate, trimethylolpropane trimethacrylate, divinylbenzene, acrylates and methacrylates of polyhydric alcohols. Acrylates and methacrylates of polyhydric alcohols are in particular selected from the group consisting of ethylene glycol di(meth)acrylate, diethylene glycol di(meth)acrylate, polyethylene glycol di(meth)acrylate, neopentyl glycol di(meth)acrylate, hexane-1,6-diol di(meth)acrylate, nonane-1,9-diol di(meth)acrylate, decane-1,10-diol di(meth)acrylate.

There is no particular restriction here upon the proportion of the crosslinkers comprised by the composition (B). The proportion of the crosslinkers in the composition (B) is in particular 0.005% to 5% by weight, preferably 0.01% to 3% by weight, more preferably 0.05% to 3% by weight and yet more preferably 0.1% to 1.5% by weight based in each case on the mass of all polyolefin copolymers comprised by the composition (B).

Silane coupling agents usable in accordance with the invention in the composition (B) include all silanes having an unsaturated hydrocarbyl radical and a hydrolysable radical (described, for instance, in EP 2 436 701 B1, U.S. Pat. No. 5,266,627).

Unsaturated hydrocarbyl radicals are in particular selected from the group consisting of vinyl, allyl, isopropenyl, butenyl, cyclohexenyl, γ-(meth)acryloyloxyallyl.

Hydrolysable radicals are in particular selected from the group consisting of hydrocarbyloxy, hydrocarbonyloxy, hydrocarbylamino. The hydrolysable radical is preferably selected from the group consisting of methoxy, ethoxy, formyloxy, acetoxy, propionyloxy, alkylamino, arylamino.

The silane coupling agent is preferably selected from the group consisting of: vinyltriethoxysilane, vinyltris-(β-methoxyethoxy)silane, vinyltriacetoxysilane, γ-acryloyloxypropyltrimethoxysilane γ-methacryloyloxypropyltrimethoxysilane, N-(β-aminoethyl)-γ-aminopropyltrimethoxysilane, N-β-aminoethyl)-γ-aminopropylmethyldimethoxysilane, γ-aminopropyltriethoxysilane, γ-glycidoxypropyltrimethoxysilane, γ-mercaptopropyltriethoxysilane, γ-chloropropyltrimethoxysilane, β-(3,4-ethoxycyclohexypethyltrimethoxysilane, γ-mercaptopropyltrimethoxysilane. Particular preference is given to using the silane coupling agent γ-methacryloyloxypropyltrimethoxysilane (abbreviated to "KBM").

There is no particular restriction here upon the proportion of the silane coupling agent comprised by the composition (B). The proportion of all silane coupling agents comprised by the composition (B) is in particular 0.05% to 5% by weight and preferably 0.1% to 2% by weight based in each case on the mass of all polyolefin copolymers comprised by the composition (B).

Antioxidants in the context of the invention are preferably selected from the group consisting of phenolic antioxidants, phosphorous antioxidants.

Phenolic antioxidants are in particular selected from the group consisting of 4-methoxyphenol, 2,6-di-tert-butyl-4-methylphenol, tert-butylhydroquinone, stearyl β-(3,5-di-tert-butyl-4-hydroxyphenyl)propionate, pentaerythrityl tetrakis[3-(3,5-di-tert-butyl-4-hydroxyphenyl)propionate], hexadecyl 3,5-di-tert-butyl-4-hydroxybenzoate.

Phosphorous antioxidants are in particular selected from the group consisting of triphenyl phosphite, tris(nonylphenyl) phosphite, distearylpentaerythritol diphosphite, tetra(tridecyl)-1,1,3-tris-(2-methyl-5-tert-butyl-4-hydroxyphenyl)butane diphosphate, tetrakis(2,4-di-tert-butylphenyl)-4,4-biphenyl diphosphonite.

There is no particular restriction here upon the proportion of the antioxidants comprised by the composition (B). The proportion of all antioxidants comprised by the composition (B) is in particular 0.01% to 0.5% by weight and preferably 0.05% to 0.3% by weight based in each case on the mass of all polyolefin copolymers comprised by the composition (B).

In the context of the invention ageing stabilizers are in particular selected from the group of "hindered amine light stabilizers" (="HALS") and UV absorbers.

In the context of the invention HALS stabilizers are in particular compounds having at least one 2,2,6,6-tetramethyl-4-piperidyl radical, where the nitrogen atom at the 1 position of the piperidyl radical bears an H, an alkyl group or an alkoxy group.

Preference is given to HALS stabilizers selected from the group consisting of bis(2,2,6,6-tetramethyl-4-piperidyl) sebacate, 1,2,2,6,6-pentamethyl-4-piperidyl sebacate, bis(1,2,2,6,6-pentamethyl-4-piperidyl) sebacate, bis(1-octyloxy-2,2,6,6-tetramethyl-4-piperidyl)sebacate, poly{(6-morpholino-S-triazine-2,4-diyl)[2,2,6,6-tetramethyl-4-piperidyl)imino]hexamethylene[(2,2,6,6-tetramethyl-4-piperidyl)imino]} having CAS Number 82451-48-7, polymers of CAS Number 193098-40-7, copolymers of dimethyl succinate and 1-(2-hydroxyethyl)-2,2,6,6-tetramethyl-4-piperidinol, N,N',N'',N'''-tetrakis{4,6-bis[butyl(N-methyl-2,2,6,6-tetramethylpiperidin-4-yl)amino]triazin-2-yl}-4,7-diazadecane-1,10-diamine having CAS Number 106990-43-6.

There is no particular restriction here upon the proportion of the HALS stabilizers comprised by the composition (B). The proportion of all HALS stabilizers comprised by the composition (B) is in particular 0.01% to 0.5% by weight and preferably 0.05% to 0.3% by weight based in each case on the mass of all polyolefin copolymers comprised by the composition (B).

UV absorbers are in particular selected from the group consisting of 2-hydroxy-4-N-octoxybenzophenone, 2,4-di-tert-butylphenyl 3,5-di-tert-butyl-4-hydroxybenzoate, 2-hydroxy-4-methoxybenzophenone, 2,2-dihydroxy-4-methoxybenzophenone, 2-hydroxy-4-methoxy-4-carboxybenzophenone, 2-(2-hydroxy-3,5-di-tert-butylphenyl)benzotriazole, 2-(2-hydroxy-5-methylphenyl)benzotriazole, p-octylphenyl salicylate, 2-(4,6-diphenyl-1,3,5-triazin-2-yl)-5-[(hexyl)oxy]phenol, ethyl 2-cyano-3,3-diphenylacrylate.

There is no particular restriction here upon the proportion of the UV absorbers comprised by the composition (B). The proportion of all UV absorbers comprised by the composition (B) is in particular 0.01% to 0.5% by weight and preferably 0.05% to 0.3% by weight based in each case on the mass of all polyolefin copolymers comprised by the composition (B).

In accordance with the invention metal oxides are in particular selected from the group consisting of alkali metal oxides, alkaline earth metal oxides, zinc oxide, and preferably selected from the group consisting of magnesium oxide, zinc oxide.

There is no particular restriction here upon the proportion of the metal oxides comprised by the composition (B). The proportion of all the metal oxides comprised by the composition (B) is in particular 0.01% to 10% by weight and preferably 0.05% to 3% by weight based in each case on the mass of all polyolefin copolymers comprised by the composition (B).

In accordance with the invention metal hydroxides are in particular selected from the group consisting of alkali metal hydroxides, alkaline earth metal hydroxides, and preferably selected from the group consisting of magnesium hydroxide, calcium hydroxide.

There is no particular restriction here upon the proportion of the metal hydroxides comprised by the composition (B). The proportion of all metal hydroxides comprised by the composition (B) is in particular 0.01% to 10% by weight and preferably 0.05% to 3% by weight based in each case on the mass of all polyolefin copolymers comprised by the composition (B).

In the context of the invention white pigments are in particular selected from the group titanium dioxide, zinc oxide, zinc sulphide, barium sulphate, lithopone.

There is no particular restriction here upon the proportion of the white pigments comprised by the composition (B). The proportion of all the white pigments comprised by the composition (B) is in particular 5% to 25% by weight, preferably 10% to 20% by weight and yet more preferably 15% by weight based in each case on the mass of all polyolefin copolymers comprised by the composition (B).

In a further aspect of the present invention the polymer composition (B) is used to produce a film for encapsulating an electronic device, especially a solar cell.

Here, the composition (B) is initially produced by mixing the composition (A) and the particular additives and the polyolefin copolymer. This is effected in particular by adding the additives in liquid form, i.e. in pure form or as a solution in a solvent, to the composition (B) in a mixer. This is followed by stirring or keeping the mixture in motion until the liquid has been completely absorbed by the polymer pellets. Any solvents used are then removed again by applying a vacuum.

In a second step, the polymer formulation is extruded by means of an extruder to give a film. In this case, the composition (B) is metered continuously through a metering screw into an extruder in which the polymer is melted and the additives are distributed homogeneously in the polymer matrix by the kneading of the mixture. At the end of the extruder, the melt is pushed through a slot die. Downstream of the die, the film is drawn by a roller system, cooled and wound.

Alternatively, the additives or the additive mixture may also be metered directly into the film extruder via the filling port or via a side feed.

The examples which follow are intended to further illustrate the present invention, without any intention that it be restricted to these examples.

Having generally described this invention, a further understanding can be obtained by reference to certain specific examples which are provided herein for purposes of illustration only, and are not intended to be limiting unless otherwise specified.

EXAMPLES

1. Chemicals Used 1,3-Diallylurea (CAS: 1801-72-5) was sourced from Sigma-Aldrich.

Diallyl n-propyl isocyanurate (CAS: 5320-25-2) was sourced from ABCR GmbH.

Diallylamine (CAS: 124-02-7) was sourced from Tokyo Chemical Industry Co., Ltd.

Allyl isocyanate (CAS: 1426-23-9) was sourced from Sigma Aldrich.

Oxalyl chloride (CAS: 79-37-8) was sourced from Merck KGaA.

Diallyl isocyanurate (CAS: 6294-79-7) was sourced from ABCR GmbH.

The γ-methacryloyloxypropyltrimethoxysilane (="KBM") used in what follows was "Dynasylan Memo®" from Evonik Industries AG.

The EVA used in what follows was "EVATANE 28-40" ® from Arkema having a vinyl acetate content of 28.3% by weight.

The tert-butyl peroxy-2-ethylhexylcarbonate (="TB-PEHC") used in what follows was obtained from United Initiators.

Triallylurea and diallylimidazolidinetrione were obtained from diallylamine and 1,3-diallylurea respectively as follows [as per S. H. Üngören, I. Kani, A. Günay, Tetrahedron Letters, 53, (2012), 4758-4762].

1.1 Synthesis of Triallylurea 1 g (10.3 mmol) of diallylamine (CAS: 124-02-7), 1.06 g of triethylamine (10.4 mmol) were dissolved in 90 mL of dichloromethane. 1 g (12 mmol) of allyl isocyanate (CAS: 1476-23-9) were slowly added dropwise. At room temperature complete conversion to product was observed after 2 h. Purification was effected by washing with distilled water.

1.2 Synthesis of Diallylimidazolidinetrione 4.8 g (34.2 mmol) of diallylurea (CAS: 1801-72-5) were dissolved in 90 mL of dichloromethane. 4.35 g (34.2 mmol)

of oxalyl chloride (CAS: 79-37-8) dissolved in 10 mL of dichloromethane were added dropwise to this solution at room temperature. The reaction mixture was heated to 40° C. for 1.5 h. Purification with 20% NaCl solution, saturated NaHCO$_3$ solution and distilled water afforded the product in 80% yield.

2. Production of the Example Formulations 2.1 Comparative Example C1

2.5 g (10.0 mmol) of triallyl isocyanurate were homogeneously mixed with 0.5 g of KBM and 4.0 g of TBPEHC. The mixture was uniformly distributed over 493 g of EVA and the additive mixture thus obtained was then commixed in a tumbler mixer for 2 to 4 hours.

2.2 Inventive Examples 1 to 8

Example 1

2.40 g (9.63 mmol) of TALC, together with 0.10 g (0.71 mmol) of 1,3-diallylurea, 0.5 g of KBM and 4.0 g of TBPEHC, were homogeneously mixed. The mixture was uniformly distributed over 493 g of EVA and the additive mixture thus obtained was then commixed in a tumbler mixer for 2 to 4 hours.

Example 2

2.45 g (9.83 mmol) of TALC, together with 0.05 g (0.28 mmol) of triallylurea, 0.5 g of KBM and 4.0 g of TBPEHC, were homogeneously mixed. The mixture was uniformly distributed over 493 g of EVA and the additive mixture thus obtained was then commixed in a tumbler mixer for 2 to 4 hours.

Example 3

2.45 g (9.83 mmol) of TAIC, together with 0.05 g (0.26 mmol) of diallylimidazolidinetrione, 0.5 g of KBM and 4.0 g of TBPEHC, were homogeneously mixed. The mixture was uniformly distributed over 493 g of EVA and the additive mixture thus obtained was then commixed in a tumbler mixer for 2 to 4 hours.

Example 4

2.40 g (9.63 mmol) of TALC, together with 0.10 g (0.52 mmol) of diallylimidazolidinetrione, 0.5 g of KBM and 4.0 g of TBPEHC, were homogeneously mixed. The mixture was uniformly distributed over 493 g of EVA and the additive mixture thus obtained was then commixed in a tumbler mixer for 2 to 4 hours.

Example 5

2.48 g (9.93 mmol) of TAIC, together with 0.025 g (0.12 mmol) of diallyl isocyanurate, 0.5 g of KBM and 4.0 g of TBPEHC, were homogeneously mixed. The mixture was uniformly distributed over 493 g of EVA and the additive mixture thus obtained was then commixed in a tumbler mixer for 2 to 4 hours.

Example 6

2.47 g (9.90 mmol) of TAIC, together with 0.030 g (0.12 mmol) of diallyl n-propyl isocyanurate, 0.5 g of KBM and 4.0 g of TBPEHC, were homogeneously mixed. The mixture was uniformly distributed over 493 g of EVA and the additive mixture thus obtained was then commixed in a tumbler mixer for 2 to 4 hours.

Example 7

2.41 g (9.68 mmol) of TAIC, together with 0.088 g (0.35 mmol) of diallyl n-propyl isocyanurate, 0.5 g of KBM and 4.0 g of TBPEHC, were homogeneously mixed. The mixture was uniformly distributed over 493 g of EVA and the additive mixture thus obtained was then commixed in a tumbler mixer for 2 to 4 hours.

Example 8

2.38 g (9.56 mmol) of TAIC, together with 0.118 g (0.47 mmol) of diallyl n-propyl isocyanurate, 0.5 g of KBM and 4.0 g of TBPEHC, were homogeneously mixed. The mixture was uniformly distributed over 493 g of EVA and the additive mixture thus obtained was then commixed in a tumbler mixer for 2 to 4 hours.

3. Film Extrusion

To produce the EVA films, the conditioned EVA pellets which had been prepared as described in the comparative example and the inventive examples 1 to 8 were volumetrically metered into a twin-screw laboratory extruder (Collin). The EVA melt was extruded through a slot die (10 cm) with adjustable slot width, the film was continuously cooled to 20° C. on a roller system and subsequently wound. The extruder settings are as follows:

| Temperature of the heating zones for EVA film production [° C.] | |
| --- | --- |
| T1 | 70 |
| T2 | 77 |
| T3 | 77 |
| T4 | 75 |
| T5 | 80 |
| Die | 80 |
| T(melt) | 87-90 |

4. Film Lamination

The lamination of the EVA film was conducted at 150° C. (machine setting) between Teflon release films, this temperature being kept constant over the entire lamination process. The duration of the single stage degassing step was 100 s. The sample was subsequently compressed with an applied pressure of 0.7 kg/cm$^2$. The residence time in the laminator was 20 minutes.

5. Determination of Specific Resistance ρ

Determining the resistivity of crosslinked EVA films having a thickness of 400 to 500 μm comprised initially storing samples having dimensions of about 8×8 cm at room temperature (22.5° C.) and a relative atmospheric humidity of 50% for 7 days to ensure a constant moisture level within the EVA film.

Resistivity measurement was conducted with a Keithley ohmmeter (6517B) and a corresponding test cell, likewise from Keithley ("resistivity test fixture 8009"). In accordance with ASTM D-257, the sample was subjected to a voltage of 500 V for 60 s and the current was measured after this time.

The resistivity (VR) may then be calculated from the known parameters.

6. Results of the Resistivity Measurements for the Example Formulations

Table 1 which follows gives an overview of the VR values measured in the respective examples:

TABLE 1

| Example no. | TAIC in mmol; weight in "[ ]" | Crosslinking additive | Additive in mmol; weight in "[ ]" | Proportion of additive based on TAIC in mol % | Proportion of additive based on TAIL in % by weight | VR * 10^15 [ohm*cm] |
|---|---|---|---|---|---|---|
| C1 | 10.0 [2.50 g] |  | 0 | 0 | 0 | 3.77 |
| 1 | 9.63 [2.40 g] | 1,3-diallylurea | 0.71 [0.10 g] | 7.4 | 4.14 | 4.57 |
| 2 | 9.83 [2.45 g] | triallylurea | 0.28 [0.05 g] | 2.8 | 2.06 | 6.91 |
| 3 | 9.83 [2.45 g] | diallylimidazolidinetrione | 0.26 [0.050 g] | 2.6 | 2.0 | 5.29 |
| 4 | 9.63 [2.40 g] | diallylimidazolidinetrione | 0.52 [0.101] | 5.4 | 4.2 | 4.40 |
| 5 | 9.93 [2.48 g] | diallyl isocyanurate | 0.12 [0.025 g] | 1.2 | 1.0 | 4.52 |
| 6 | 9.90 [2.47 g] | diallyl n-propyl isocyanurate | 0.12 [0.030 g] | 1.2 | 1.2 | 3.87 |
| 7 | 9.68 [2.41 g] | diallyl n-propyl isocyanurate | 0.35 [0.088 g] | 3.6 | 3.7 | 5.39 |
| 8 | 9.56 [2.38 g] | diallyl n-propyl isocyanurate | 0.47 [0.118 g] | 4.9 | 5.0 | 4.82 |

The results shown in Table 1 demonstrate that it is possible to obtain films having a high specific resistance using the co-crosslinker system according to the invention, i.e. composition (A). Thus, all VR values for the films produced with the co-crosslinker system according to the invention are higher than the value for the film which was obtained with a related art crosslinker, TAIC.

European patent application No. EP14199289 filed Dec. 19, 2014, is incorporated herein by reference.

Numerous modifications and variations on the present invention are possible in light of the above teachings. It is therefore to be understood that within the scope of the appended claims, the invention may be practiced otherwise than as specifically described herein.

The invention claimed is:

1. A composition (A), comprising:
   (i) at least one compound (I) selected from the group consisting of triallyl isocyanurate, and triallyl cyanurate; and
   (ii) at least one compound (II);
   wherein the compound (II) is defined by a chemical structural formula selected from the group consisting of (II-A), (II-B), (II-C), (II-D) wherein

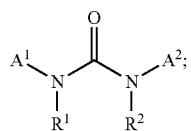
(II-A)

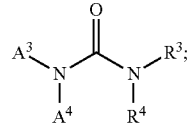
(II-B)

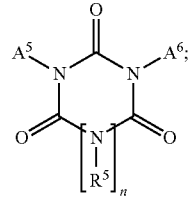
(II-C)

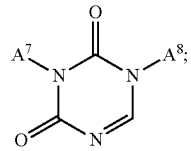
(II-D)

and wherein n=0 or 1;

$A^1, A^2, A^3, A^4, A^5, A^6, A^7, A^8$ are each independently of one another selected from the group consisting of i) a methacryloyl group, ii) an acryloyl group, and iii) a branched or unbranched alkenyl group having 3 to 18 carbon atoms and having at least one terminal double bond;

$R^1, R^2, R^3, R^4, R^5$ are each independently of one another selected from the group consisting of the following a, b and c):

a) hydrogen, b) a branched or unbranched alkyl group having 1 to 20 carbon atoms, wherein one or more hydrogen radicals may each be substituted by a halogen radical and wherein in addition one or two hydrogen radicals may each be substituted by a radical selected from the group consisting of —OR$^6$, and —C(=O)NR$^7$R$^8$, wherein R$^6$, R$^7$, R$^8$ are each independently of one another selected from the group consisting of hydrogen, branched and unbranched alkyl group having 1 to 10 carbon atoms, and c) a cycloalkyl group having 3 to 12 carbon atoms, wherein one or more hydrogen radicals may each be substituted by a halogen radical and wherein in addition one or two hydrogen radicals may each be substituted by a radical selected from the group consisting of —OR$^9$, and —C(=O)NR$^{10}$R$^{11}$, wherein R$^9$, R$^{10}$, R$^{11}$ are each independently of one another selected from the group consisting of hydrogen, and a branched and unbranched alkyl group having 1 to 10 carbon atoms, and wherein the radicals R$^1$ and R$^2$ may each also be selected from the group consisting of methacryloyl group, acryloyl group, and a branched or unbranched alkenyl group having 3 to 18 carbon atoms and having at least one terminal double bond;

and wherein at least one compound (II) in the composition (A) is present in a proportion of at least 1% by weight based on a total weight of all compounds (I) in the composition (A).

2. The composition (A) according to claim 1, wherein the compound (I) is triallyl isocyanurate.

3. The composition (A) according to claim 1, wherein n=0 or 1;
A$^1$, A$^2$, A$^3$, A$^4$, A$^5$, A$^6$, A$^7$, A$^8$ are each independently of one another selected from the group consisting of a methacryloyl group, an acryloyl group, and an allyl group;
R$^1$, R$^2$, R$^3$, R$^4$, R$^5$ are each independently of one another selected from the group consisting of hydrogen, and a branched or unbranched alkyl group having 1 to 20 carbon atoms;
and wherein in addition the radicals R$^1$ and R$^2$ may each also be selected from the group consisting of a methacryloyl group, an acryloyl group, and an allyl group.

4. The composition (A) according to claim 3, wherein the compound (II) is defined by a chemical structural formula selected from the group consisting of (II-A), and (II-B); and wherein
A$^1$, A$^2$, A$^3$, A$^4$ are each independently of one another selected from the group consisting of a methacryloyl group, an acryloyl group, and an allyl group;
R$^1$, R$^2$, R$^3$, R$^4$ are each independently of one another selected from the group consisting of hydrogen, and a branched or unbranched alkyl group having 1 to 20 carbon atoms;
and wherein in addition the radicals R$^1$ and R$^2$ may each also be selected from the group consisting of a methacryloyl group, an acryloyl group, and an allyl group.

5. The composition (A) according to claim 1, wherein a total weight of all compounds (II) in the composition (A) is 1% to 50% by weight based on a total weight of all compounds (I) in the composition (A).

6. The composition (B), comprising:
at least one polyolefin copolymer; and
a composition (A) according to claim 1.

7. The composition (B) according to claim 6, wherein the polyolefin copolymer is an ethylene-vinyl acetate copolymer.

8. The composition (B) according to claim 7, wherein the ethylene-vinyl acetate copolymer has a vinyl acetate content of 15% to 50% by weight based on a total weight of the ethylene-vinyl acetate copolymer and determined as per ASTM D 5594:1998.

9. The composition (B) according to claim 6, in which the proportion of composition (A) is 0.05% to 10% by weight based on a mass of all polyolefin copolymers in the composition (B).

10. The composition (B) according to claim 6 which further comprises at least one initiator selected from the group consisting of peroxidic compounds, azo compounds, and photo initiators.

11. The composition (B) according to claim 10, wherein the initiator is a peroxidic compound.

12. The composition (B) according to claim 6 which further comprises at least one compound (D) selected from the group consisting of crosslinkers, silane coupling agents, antioxidants, ageing stabilizers, metal oxides, metal hydroxides, and white pigments.

13. The composition (B) according to claim 12, wherein the compound (D) is a silane coupling agent.

14. A film for encapsulation of an electronic device, comprising:
the composition (B) according to claim 6 in crosslinked form.

15. The film according to claim 14, wherein the device is a solar cell.

16. A method for encapsulating an electronic device, comprising:
contacting said electronic device with the composition (B) of claim 6 and crosslinking said composition (B).

17. The method according to claim 16, wherein the device is a solar cell.

18. The method according to claim 17, wherein the crosslinking of the composition (B) occurs in the course of solar module lamination.

* * * * *